(12) United States Patent
Deppisch et al.

(10) Patent No.: US 7,439,617 B2
(45) Date of Patent: Oct. 21, 2008

(54) CAPILLARY UNDERFLOW INTEGRAL HEAT SPREADER

(75) Inventors: Carl Deppisch, Chandler, AZ (US); Tom Fitzgerald, Phoenix, AZ (US); Fay Hua, Freemont, CA (US); Wei Shi, Gilbert, AZ (US); Mike Gasparek, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/479,577

(22) Filed: Jun. 30, 2006

(65) Prior Publication Data

US 2008/0017975 A1 Jan. 24, 2008

(51) Int. Cl.
*H01L 23/10* (2006.01)
*H01L 23/24* (2006.01)

(52) U.S. Cl. .................. 257/707; 257/706; 257/710; 257/714

(58) Field of Classification Search ......... 257/712–722, 257/439, 468, 625, 675, 705–708; 438/117, 438/122
See application file for complete search history.

(56) References Cited

U.S. PATENT DOCUMENTS

| | | | | |
|---|---|---|---|---|
| 5,232,962 A * | 8/1993 | Dershem et al. | ............ | 523/442 |
| 5,892,279 A * | 4/1999 | Nguyen | ............ | 257/712 |
| 5,977,626 A * | 11/1999 | Wang et al. | ............ | 257/707 |
| 6,504,242 B1 * | 1/2003 | Deppisch et al. | ............ | 257/707 |
| 6,817,091 B2 * | 11/2004 | Fitzgerald et al. | ............ | 29/840 |
| 6,952,050 B2 * | 10/2005 | Kwon et al. | ............ | 257/707 |
| 7,230,334 B2 * | 6/2007 | Andry et al. | ............ | 257/713 |
| 2002/0196650 A1 * | 12/2002 | Chang | ............ | 365/63 |
| 2004/0156173 A1 * | 8/2004 | Jeong | ............ | 361/704 |
| 2004/0188814 A1 * | 9/2004 | Houle et al. | ............ | 257/678 |
| 2005/0121776 A1 * | 6/2005 | Deppisch et al. | ............ | 257/712 |
| 2006/0103011 A1 * | 5/2006 | Andry et al. | ............ | 257/707 |

* cited by examiner

*Primary Examiner*—Zandra Smith
*Assistant Examiner*—Telly D Green
(74) *Attorney, Agent, or Firm*—Blakely, Sokoloff, Taylor & Zafman LLP

(57) ABSTRACT

A cooling device including a thermally conductive body with a first mating surface, a first solder wettable material disposed in a pattern at a portion of the first mating surface, and a reflowable solder material disposed at the first mating surface. A portion of the solder material is configured to be capable of contacting an adjacently disposed second mating surface, and when melted, to form a single flow front through a bond line gap between the first mating surface of the cooling device and the second mating surface of, for example, a thermal component.

A mating surface of the cooling device is positioned adjacent to a mating surface of a thermal component and the solder material is heated at least to its melting point. The solder material is maintained in a molten state until it has flowed into and substantially filled a bond line gap between the mating surface of the cooling device and the mating surface of the thermal component, and then cooled below its melting point, physically and/or thermally coupling the cooling device and the thermal component.

21 Claims, 7 Drawing Sheets

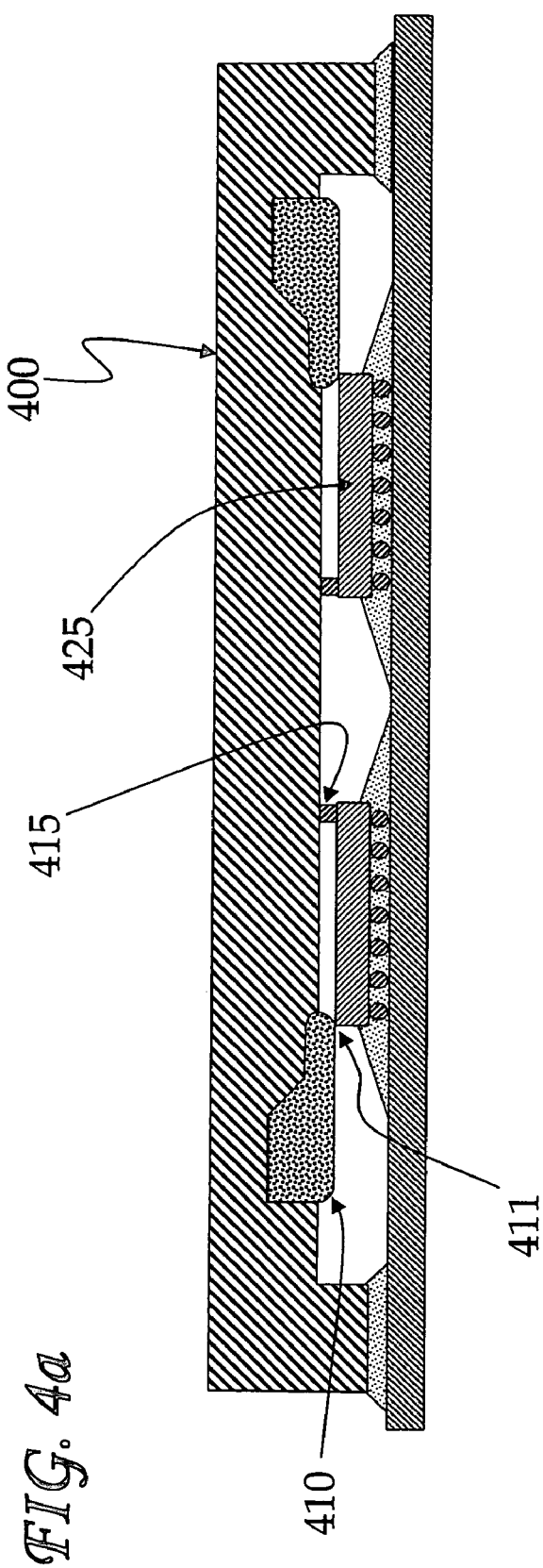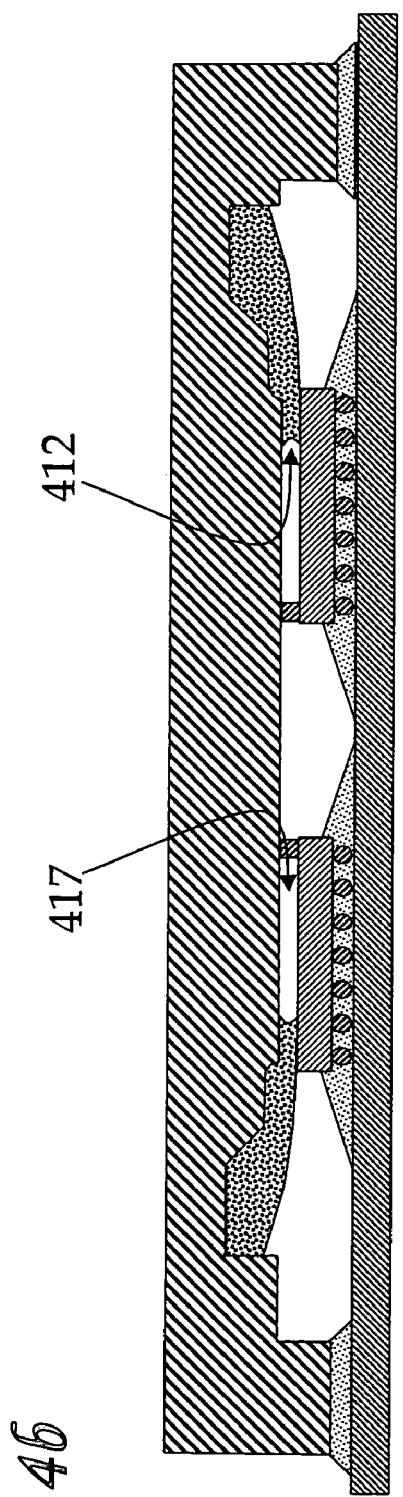

CAPILLARY UNDERFLOW INTEGRAL HEAT SPREADER

FIELD OF THE INVENTION

The invention relates generally to the field of thermal management for electronic systems. In particular, the invention relates to capillary solder underflow of an integral heat spreader.

BACKGROUND OF THE INVENTION

To dissipate heat from heat generating semiconductor devices, a number of different approaches and heat dissipating devices are used. Included among these are passive cooling devices, such as heat sinks and integral heat spreaders, and active cooling devices, such as thermoelectric coolers (TECs), fan heat sinks, refrigeration devices, multiphase cooling devices, and others. Yet, in order for any of these to effectively and efficiently cool a heat generating device, they must thermally couple with the heat generating device by some material or method having a relatively low resistance to the flow of thermal energy from the heat generating device to the heat dissipating device.

Commonly, a thermal interface material (TIM) is used between the heat generating device and the heat dissipating device to aid thermal flow. Examples of common TIMs include thermal grease, thermal gaskets, and thin foils of a solder material such as indium. A problem that is common to all of these, however, is void formation between the TIM and either the heat dissipating device or the heat generating device, or within the TIM itself. Voids may be formed by air captured between two flow fronts of a molten material, by volatile by-products of a flux material, or simply by air being trapped between surfaces of materials when a TIM is disposed at a surface of a heat generating or heat dissipating device. Air is a thermal insulator, and so an air-filled void can greatly increase the resistance to thermal flow, reducing the efficiency and effectiveness of an assembly designed to dissipate heat from a heat generating device. Likewise, other trapped gasses, such as flux volatiles, also interfere with efficient thermal flow in such assemblies.

While voids present a problem in most applications, the problem is magnified in thin die, thin TIM (TDTT) applications, because trapped bubbles tend to flatten out and occupy a larger percentage of the total bond line between devices, imposing a greater detrimental effect on the thermal flow from a heat generating thin die chip device to a heat dissipation device. In addition to interfering with thermal flow, voids in TDTT applications can also promote premature package failure due to overheating, heat induced defects (e.g., delamination, cracking).

One approach used to minimize voids is the use of a vacuum oven to remove the flux volatiles during reflow immediately prior to, for example, and indium solder material becoming molten. While effective, vacuum ovens are costly and difficult to implement in high volume manufacturing due to their inherently small capacity. Further, vacuum ovens are ineffective at preventing another source of voiding, that of the inability of a thin preformed solder TIM, as is sometimes used in TDTT applications, to accommodate and fill variable gap widths due to warpage of a thin die chip device.

Voiding in or at the TIM is a major obstacle in TDTT development and manufacturing, particularly as advanced chip device feature sizes decrease in size, and generate increased amounts of heat that must be dissipated.

BRIEF DESCRIPTION OF THE DRAWINGS

FIG. 4a depicts a cross-sectional view of a capillary underflow IHS disposed adjacent to a semiconductor chip prior to reflowing a solder material, according to an embodiment of the invention.

FIG. 4b depicts a cross-sectional view of a capillary underflow IHS disposed adjacent to a semiconductor chip including a reflowing solder material, according to an embodiment of the invention.

DETAILED DESCRIPTION OF THE INVENTION

A capillary underflow cooling device (cooling device), according to various embodiments of the invention, is a passive cooling device (e.g., heat sink, integrated heat spreader) or an active cooling device (e.g., fan heat sink, multi-phase cooling device, thermoelectric cooler), used to dissipate heat from a thermal component. A thermal component, in embodiments, is a device, a portion of which, during normal use, possesses an amount of thermal energy in excess of the ambient environment, of the cooling device, or of another portion of the thermal component, or in excess of a predetermined threshold temperature or range of temperatures for that portion of the device. A predetermined threshold temperature may be a temperature above which the risk of damage to the device or to surrounding components or materials increases, performance or reliability may decrease, or some other unintended consequence or risk may occur.

Figure 1:
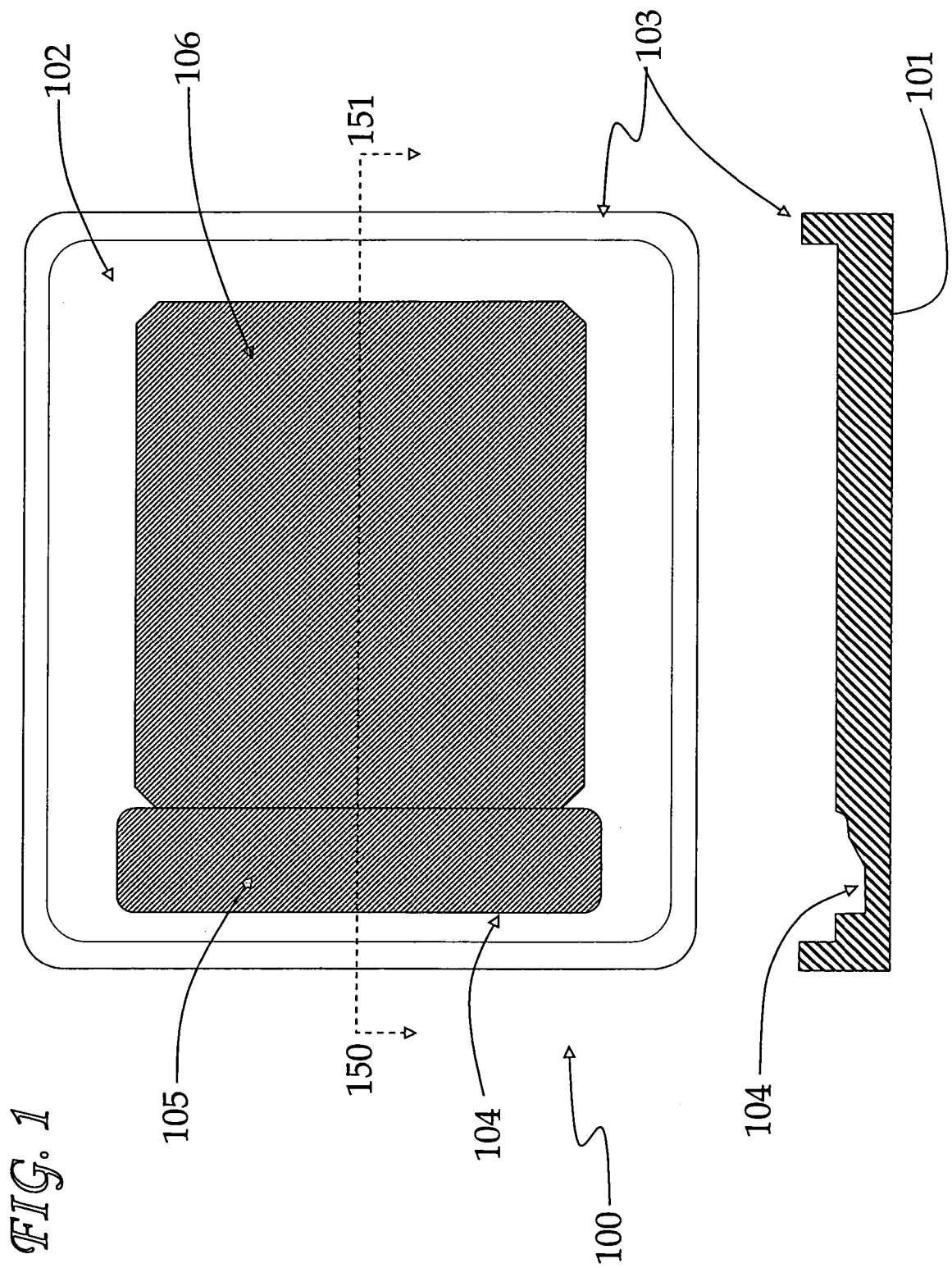
FIG. 1 depicts two views of a capillary underflow integrated heat spreader (IHS) according to an embodiment of the invention.

In an exemplary embodiment depicted in FIG. 1 and referred to hereinafter, a capillary underflow integral heat spreader (IHS)) is a cooling device 100 and a semiconductor device ('chip') is a thermal device. An IHS typically includes a main body portion 101 ('body') with a mating surface 102, and generally includes at least one attachment portion 103, although in some embodiments of a cooling device, the mating surface also acts as an attachment portion. The body 101 is formed of a thermally conductive material, typically a metal or metallic alloy, but the embodiments are not so limited. The attachment portion 103 is configured for physically coupling the IHS 100 with a substrate, such as a printed circuit board or some other structural member, or in some embodiments, with a portion of a thermal component itself. In the exemplary embodiment of an IHS, the attachment portion 103 is typically formed as a raised 'lip' around most or all of the periphery of the mating surface. In embodiments, the attachment portion 103 physically couples with a substrate using an adhesive material, typically a heat resistant adhesive, substantially enclosing a semiconductor chip within a cavity defined in part by the attachment portion 103 and the mating surface 102 of the IHS 100, and in part by the substrate surface.

The mating surface 102 of the IHS is that surface of the IHS body that faces a chip when an IHS is assembled with a chip. The mating surface 102 is typically thermally coupled with a mating surface of the chip by a thermal interface material (TIM) such as a solder material. In an exemplary embodiment, a solder TIM will include a quantity of indium or an alloy of indium. Other materials suitable for use in embodiments include lead or an alloy of lead, or alloys of silver, tin, gold, or bismuth, or other reflowable thermally conductive solder materials, such as a phase change polymer material, or a particle filled metallic solder material, wherein the particles include at least one of aluminum, diamond, or another thermally conductive material different from the metallic solder material. Although these listed materials may be commonly used in embodiments, the embodiments are not so limited, and could include other reflowable, thermally conductive materials, or some combination of those listed here.

To promote adhesion of a solder TIM with the IHS, a pattern of solder wettable material 106 (e.g., gold) is disposed at a portion of the mating surface 102 of the IHS. A pattern of solder wettable material 106 is, in embodiments, configured to correspond in size to the size of a mating surface of a heat bearing semiconductor chip. In other embodiments, the pattern covers the entire mating surface 102 of the IHS 100 irrespective of how closely the size of a heat bearing chip or device relates to the size of the IHS 100. In yet other embodiments, a pattern of solder wettable material 106 disposed at a mating surface 102 of an IHS 100 is substantially smaller than a heat bearing chip, but is located and sized to correspond with specific portions of the mating surface of a heat bearing chip corresponding to 'hot spots' of the chip. In addition to gold, solder wettable materials according to other embodiments include other noble metals, such as silver, platinum, and palladium, and also other metals such as indium, copper, tin, and nickel. A flux material can be used to improve wettability and adhesion of a solder material with a solder wettable material when oxidation of the surface of the solder wettable material occurs or may occur.

Embodiments of the invention include a concavity 104 formed into a mating surface 102 of an IHS 100 proximate to the disposed pattern of solder wettable material 106. In an exemplary embodiment, a majority of the concavity 104 lies outside the perimeter of the pattern of solder wettable material 106 disposed at the IHS mating surface 102. The concavity 104 will be tapered in embodiments, formed to be shallow in a portion of the concavity 104 nearest the pattern of solder wettable material 106 disposed at the IHS mating surface 102, and formed relatively deeper in the portion farther away from the solder wettable material 106 of the IHS mating surface 102. In alternative embodiments, however, the depth of the concavity 104 is uniform throughout, or non-uniform but also not tapered in the manner described above. In the described embodiments, the 'depth' of a concavity 104 is determined with reference to the plane of the mating surface 102 of the IHS 100. In general, the concavity 104 is configured to accommodate enough solder material to substantially fill a gap between a semiconductor chip and an IHS 100.

In various embodiments, a concavity 104 can be formed by stamping the concavity 104 into the mating surface 102 of an IHS 100, or by machining (e.g., milling, drilling, grinding) the IHS 100 to remove material from an area of the mating surface 102 of an IHS 100. In other embodiments, an IHS 100 is cast in a mold, and a feature of the mold creates the concavity. Material can be removed by laser ablation to form a concavity when the materials used for an IHS 100 are compatible with laser ablation.

Figure 2:
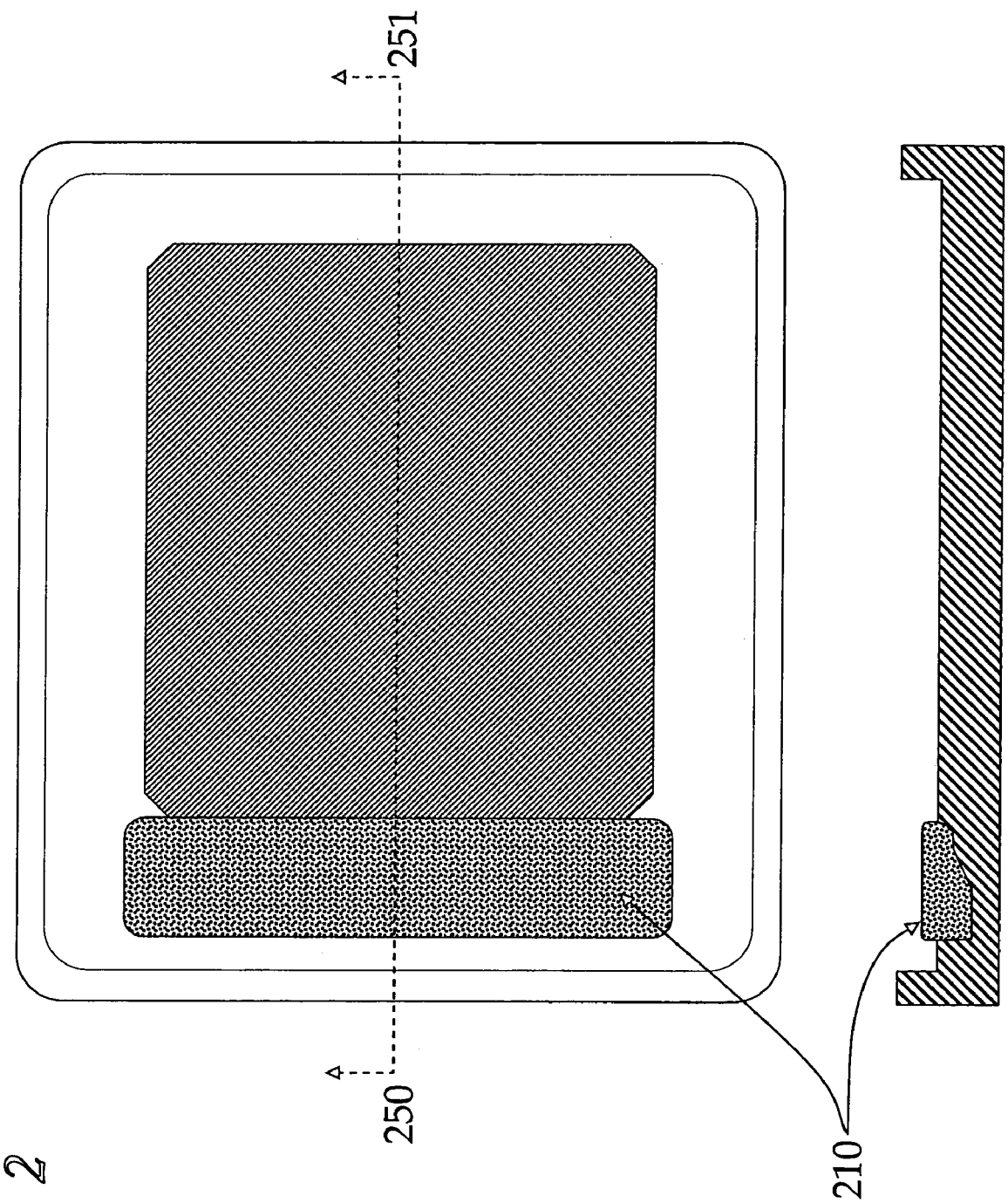
FIG. 2 depicts two views of a capillary underflow IHS according to an embodiment of the invention.

Embodiments also include disposing a solder wettable material 105 at the inner surfaces of the concavity 104. Generally, the solder wettable material 105 of the concavity 104 is disposed to be at least partially contiguous with the solder wettable material 106 of the IHS 100, however, contiguity is not necessary in all embodiments. A mating surface of a chip corresponding with the mating surface 102 of an IHS 100 will, in embodiments, also have a solder wettable material disposed in a pattern at least partially corresponding with a portion of the pattern of solder wettable material 106 of the IHS 100. When, in embodiments, an IHS 100 is assembled with a chip, and a gap is defined between adjacent mating surfaces of the IHS 100 and the chip, the extent of spread of a molten solder material throughout such a gap is largely determined by the extent of the patterns of solder wettable material, as well as the amount of separation between the mating surfaces of each of the chip and the IHS 100 (i.e., the bond line gap). Therefore, by determining the gap size, and assuming the molten solder material will spread to the full extent of (area covered by) the solder wettable material, one can estimate an amount of solder material needed in a particular application, and therefore, can estimate a volume of a concavity 104 capable of accommodating that amount of solder material 210, as depicted in FIG. 2.

For example, in an exemplary embodiment, approximately 40 cubic millimeters ($mm^3$) of solder material will substantially fill a gap between an IHS and a die wherein the pattern of solder wettable material disposed at the mating surface of the die measures 10 millimeters in width and 10 millimeters in length (approximately 100 $mm^2$ mating surface), and the gap width averages 0.4 millimeters. A concavity measuring 16 millimeters long, 1.0 millimeter deep, and 2.5 millimeters wide, formed into the mating surface of an IHS, will accommodate approximately 40 $mm^3$ of solder material.

Figure 3:
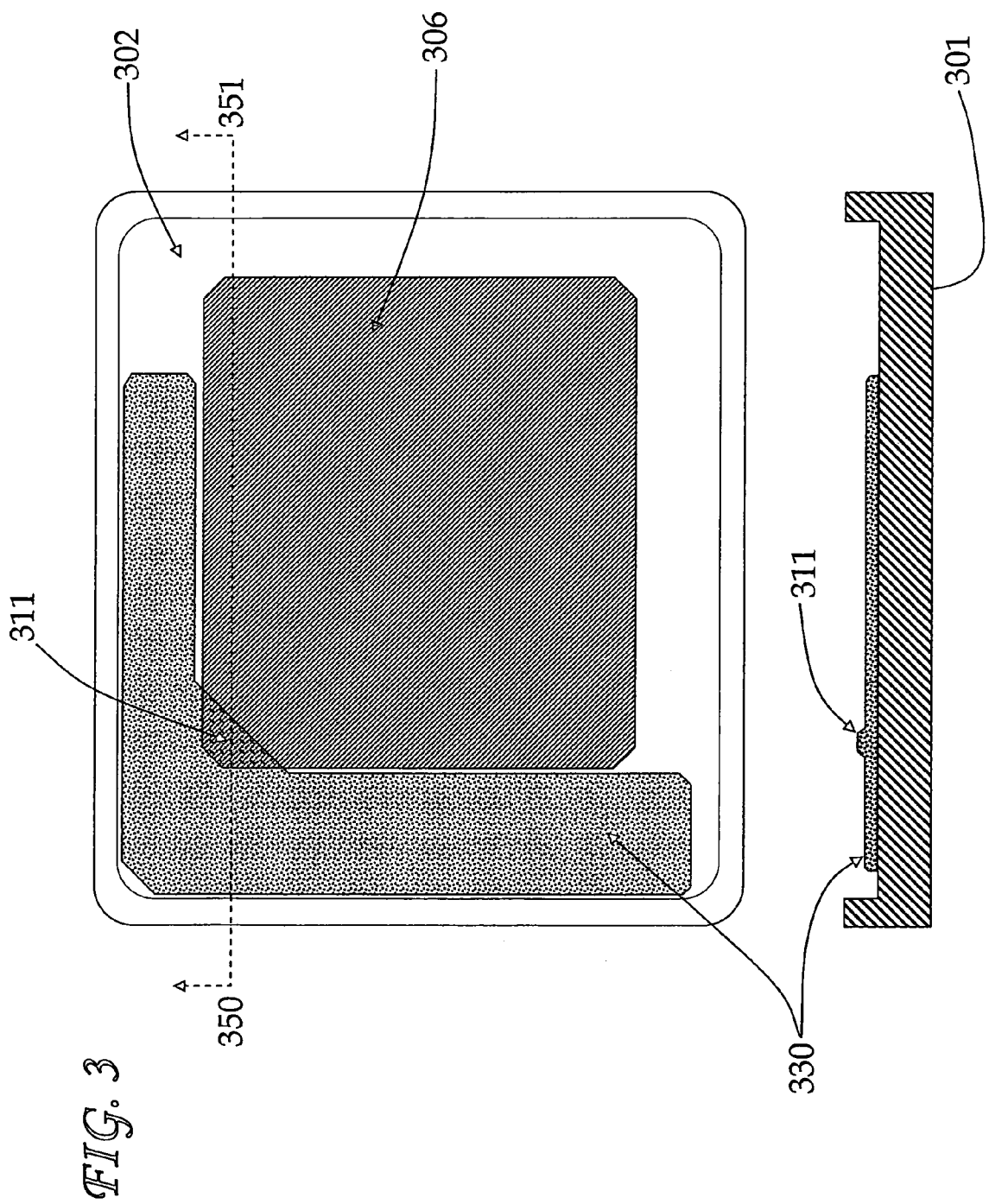
FIG. 3 depicts two views of a capillary underflow IHS according to an embodiment of the invention.

In embodiments such as that depicted in FIG. 3, no concavity is formed into the mating surface 302 of an IHS 301, but a sufficient quantity of solder material 330 is disposed at the mating surface 302 of the IHS 301 to substantially fill a bond line gap as described above. In an exemplary embodiment, the mating surface 302 of an IHS 301 is somewhat larger than the mating surface of a semiconductor chip device, and an amount of solder material 330 is disposed at the IHS mating surface 302 corresponding to and primarily outside the periphery of the portion of the IHS mating surface 302 corresponding to the mating surface of the chip. In this embodiment, a portion of the solder material 330 is configured to contact a pattern of solder wettable material disposed at the mating surface of the chip when the IHS 301 is placed proximate to the chip as when assembling the IHS 301 with the chip, and to produce a single flow front of molten solder material when the temperature of the solder material 330 is elevated to or above its melting temperature. The contacting portion of the solder material 330 is formed, in embodiments, as a dimple 311, depicted in the cross-sectional view in FIG. 3 defined by the line 350-351, or a relatively short ridge of solder material, although the embodiments are not so limited. A portion of the solder material 330 will also overlap a pattern of solder wettable material 306 disposed at the mating surface 302 of the IHS 301. A separate embodiment is similar to that just described, except that a significant amount of the solder material is disposed at a portion of the IHS mating surface corresponding with the pattern of solder wettable material at the chip mating surface, while the rest of the solder material is disposed at a portion of the IHS mating surface not corresponding with the pattern of solder wettable material at the chip mating surface.

Figure 4C:
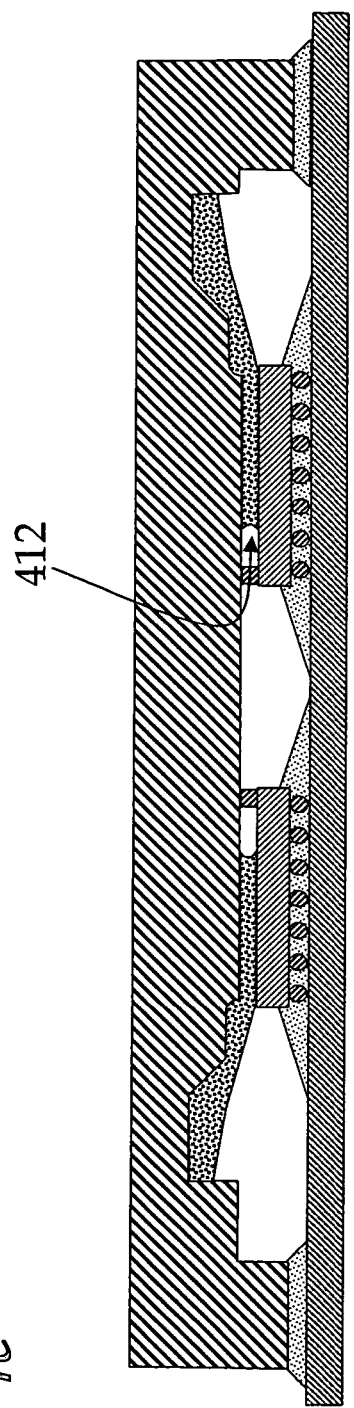
FIG. 4c depicts a cross-sectional view of a capillary underflow IHS disposed adjacent to a semiconductor chip including a reflowing solder material, according to an embodiment of the invention.
Figure 4D:
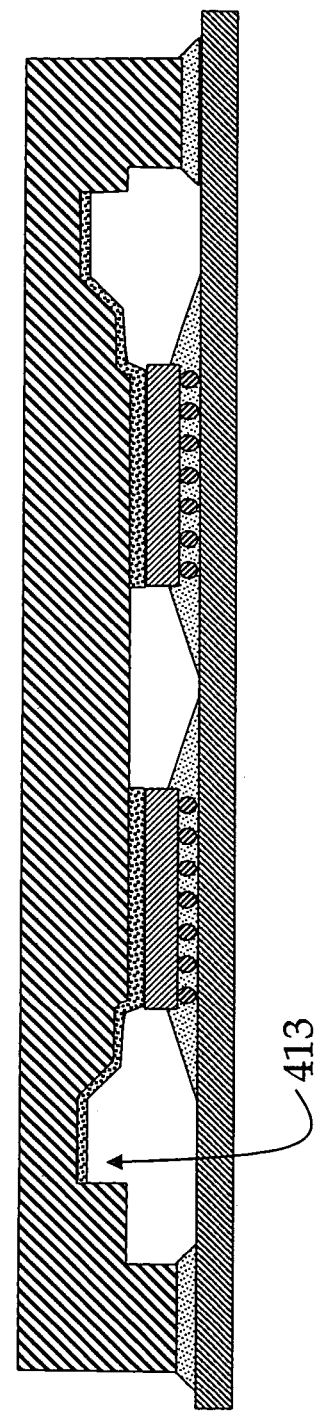
FIG. 4d depicts a cross-sectional view of a capillary underflow IHS disposed adjacent to a semiconductor chip following reflow of a solder material, according to an embodiment of the invention.

In nearly all embodiments, the solder material is disposed and configured so as to form a single flow front through a bond line gap between a cooling device and a thermal component when the temperature of the solder material is raised to or above the melting temperature of the solder material. A 'single flow front' may proceed in multiple directions simultaneously away from an origin, but generally, there will not be a confluence of flow fronts wherein air, flux by-products, or other materials could be trapped within the confluence region. A solder material 210 is disposed in embodiments so as to substantially fill a concavity 104 formed into the IHS mating surface 102, as seen in FIG. 2 in the cross-sectional view defined by the line 250-251. In an exemplary embodiment, indium is disposed in the concavity 104, and is physically coupled with the IHS 100 by any one of electroplating, casting, tack welding, or laminating a thin foil, or the solder material 210 is adhesively coupled with a portion of the surface of the concavity 104 with, for example, a polymer adhesive. With reference to FIG. 4a, in addition to substantially filling the concavity 104, an amount of the solder material 411 will also, in embodiments, protrude beyond the plane of the IHS mating surface 102, relative to the concavity 104. In an exemplary embodiment, the concavity 104 is so positioned, and the solder material 411 protrudes to such an extent, that the solder material 411 contacts the solder wettable material disposed at the mating surface of a chip 425 when the IHS 400 is positioned proximate with the chip 425, as when assembled for use. Gold is wettable by indium, so molten indium in contact with gold will tend to flow along the gold coated opposing mating surfaces of the chip 425 and the IHS 400. Further, referring to FIGS. 4b-4d, capillary action will tend to pull a molten solder material 312 through a narrow space 417, such as a gap between a chip 425 and an IHS 400. Therefore, the combined attractive forces of the capillary force and the wettability of gold disposed at the mating surfaces, draws molten indium 412 throughout a gap ('bond line') between a chip 425 and an IHS 400, substantially filling the bond line 417 and avoiding formation of void spaces. The molten indium also forces out most by-products of flux materials that may have been used to ensure a relatively unoxidized mating surface, or to remove oxidation from the indium prior to reflow. Flux is not used in all embodiments, but in some, it is added to one or all mating surfaces. Flux is also added in embodiments to the surface of the solder material prior to reflow to prevent or remove oxidation. Flux may be sprayed, brushed, rolled, laminated, or disposed at a surface by some other method as known in the art.

Embodiments further include at least three bond line spacers 415 disposed at either the mating surface of the IHS 400, the mating surface of the chip 425, or both. Bond line spacers 415 maintain a relatively uniform bond line width between the mating surfaces of a chip 425 and an IHS 400. Using the principle that three points define a plane, in an embodiment, two bond line spacers 415 are provided, and a protruding portion 411 of solder material 410 in embodiments forms at least a third bond line spacer. In other embodiments, three or more bond line spacers 415 are provided separately from the protruding solder material 411. Regarding an exemplary embodiment wherein indium is used as the solder material 410, the bond line spacers 415 are also formed of indium, and merge with the indium solder material 412 during solder reflow through the gap 417. Although indium spacers 415 will generally melt at the same temperature as an indium solder material 412, a bond line is preserved by a polymer sealant between an attachment feature of the IHS 400 and a substrate surface. The sealant typically has a lower cure temperature than the melting temperature of the solder material, so is cured before the solder material melts.

In an alternate embodiment, the separate bond line spacers 415 may be formed of or coated with gold or another material wettable by indium, and the molten indium wets and strongly bonds with the bond line spacers 415 during reflow. The bond line spacers 415 may be disposed within the periphery of a pattern of wettable material disposed upon a mating surface, disposed outside the periphery, or a combination of at least one spacer outside and at least one spacer inside the periphery. Further, bond line spacers 415 are, in embodiments, formed of a material that is not wettable by the molten solder material 412. In such embodiments, if the spacers are disposed within the periphery of the wettable material, a molten solder material 412 will tend to flow around the spacers 415, but likely will neither wet the spacers nor strongly bond with them.

Although embodiments described herein include an IHS and a single chip, the embodiments are not so limited, as an IHS may also be assembled with a plurality of chips according to alternative embodiments. For example, in the embodiments depicted in FIGS. 4a-4d, two concavities are formed into the mating surface of an IHS 400, a solder wettable material is disposed over at least a portion of the interior surfaces of the concavities, and a quantity of solder material 410 sufficient to substantially fill a bond line 417 between a portion of the mating surface of the IHS 400 and the mating surface of a chip 425 is disposed into each concavity. Two separate, non-contiguous patterns of solder wettable material are disposed at portions of the mating surface of the IHS 400, each pattern corresponding with a pattern of solder wettable material disposed at the mating surface of a semiconductor chip 425. The mating surface of the IHS 400 is positioned adjacent with the mating surfaces of the chips 425, and the solder material 412 is reflowed into and through the gaps 417 between the respective chip mating surfaces and the IHS mating surface. Because the patterns of solder wettable material on the IHS 400 typically remain separate from one another, and each corresponds with the pattern of solder wettable material on a single chip mating surface, the flow fronts of solder material 412 through each bond line 417 from each concavity remain separate from one another, therefore avoiding void formation that can occur at a junction of two or more flow fronts. Even when only a single chip 425 is used, embodiments may include forming multiple concavities when space constraints make it difficult to form a single concavity capable of containing enough solder material 410 to substantially fill a bond line gap 417 between an IHS 400 and the chip 425, however, multiple solder material 412 flow fronts from multiple concavities will increase the possibility of some void formation.

In embodiments including multiple chips 425 and a single IHS 400, three or more bond line spacers 415 at each chip mating surface maintain bond line 417 width, while in other embodiments, three or more total bond line spacers 415 are disposed to maintain a relatively uniform bond line 317 width across all the chips 425. In an exemplary embodiment of the latter, at least one bond line spacer 315 is disposed at one chip mating surface, at least one bond line spacer is disposed at another chip mating surface, and a portion of the solder material 411 protruding from a concavity beyond the plane of the IHS mating surface acts as a third bond line spacer.

According to exemplary embodiments, the thermal component is a relatively thin chip device, between approximately 200-300 microns in thickness, designed for thin die, thin TIM (TDTT) applications. In such embodiments, the bond line thickness (gap width) between the adjacent mating surfaces of the chip and an IHS tends to be quite narrow, and both the risk for forming voids, and the detrimental performance impact from void presence, is substantially higher than in embodiments having a larger bond line width. However, capillary flow of a molten solder material, originating at a concavity formed into the IHS and proceeding through the bondline, allows for thinner TIM at the die center, enabling a lower Rjc (thermal resistance) in TDTT than in other embodiments. Capillary flow also forces flux by-products out from the gap, and helps to prevent void formation. In TDTT applications wherein flux is not used, embodiments of the invention also reduce the likelihood of void formation within the TIM, or between either of the IHS or the chip and the TIM.

Figure 5:
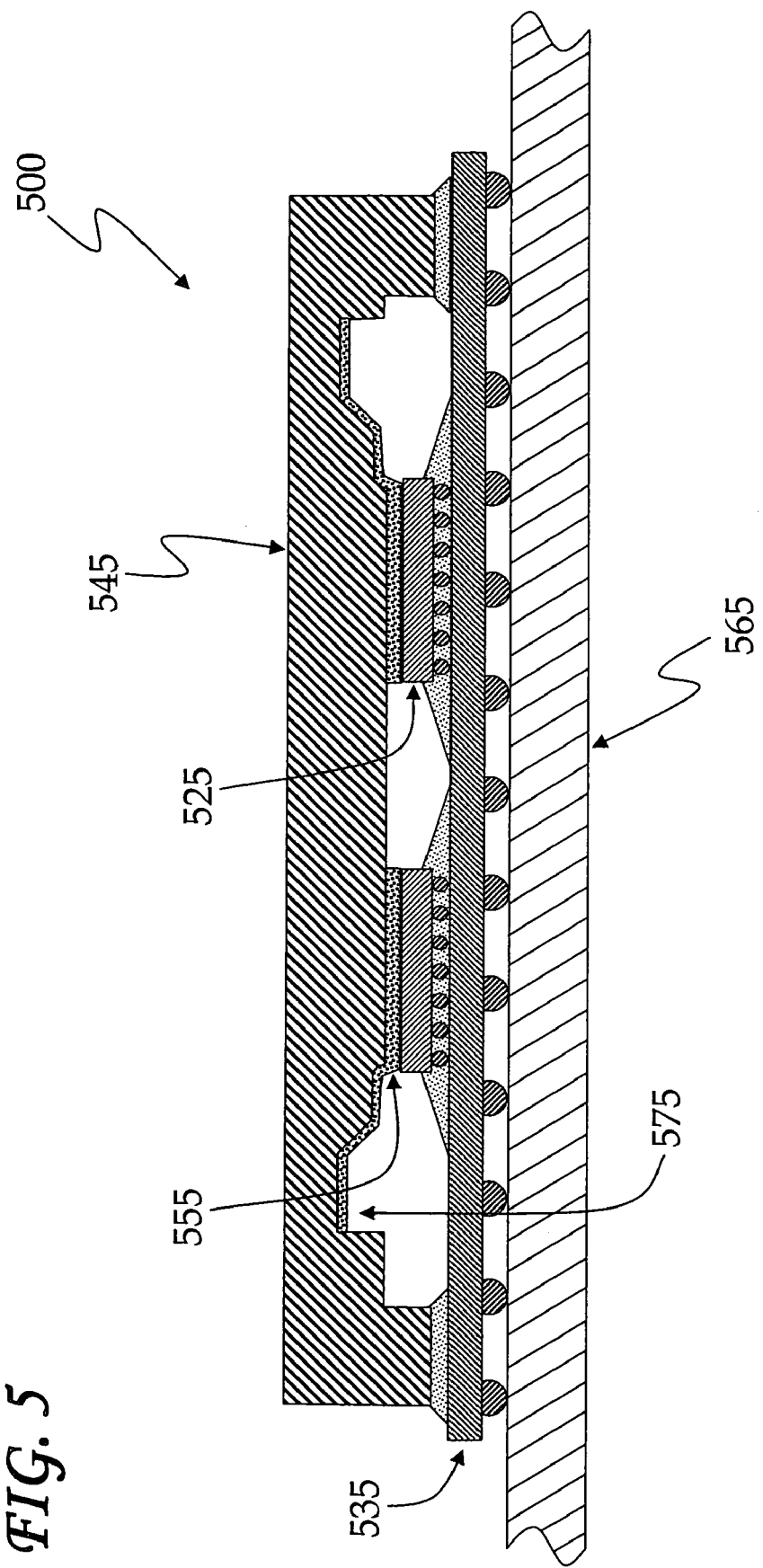
FIG. 5 depicts a cross-sectional view of an assembly including a capillary underflow IHS according to an embodiment of the invention.

Exemplary embodiments, such as that depicted in FIG. 5, include an assembly 500 in which an IHS 545 is thermally coupled with a semiconductor device 525, and the semiconductor device is further electrically coupled with a printed circuit substrate 535. A solder material 555 substantially fills a bond line gap between mating surfaces of the IHS 545 and the semiconductor device 525, and the IHS 545 is configured to include a concavity 575 formed into the mating surface, the majority of the concavity 575 lying outside the periphery of a pattern of solder wettable material disposed at the mating surface of the IHS 545.

A printed circuit substrate 535, in alternate embodiments, includes a package substrate of a semiconductor package, a computer motherboard, or a removable computer card (e.g., network card, graphics card, telephony card, audio modem riser (AMR), such as a Peripheral Component Interconnect (PCI) card, although the embodiments are not so limited. In further embodiments of an assembly including an IHS 545 thermally coupled with a semiconductor device 525 and the semiconductor device 525 electrically coupled with a package substrate 535, the package substrate 535 is further electrically coupled with a computer motherboard 565. Embodiments of computer motherboards 565 include motherboards used in desktop and mobile computers, servers, and large scale computers that incorporate numerous semiconductor devices to carry out complex processing tasks.

Figure 6:
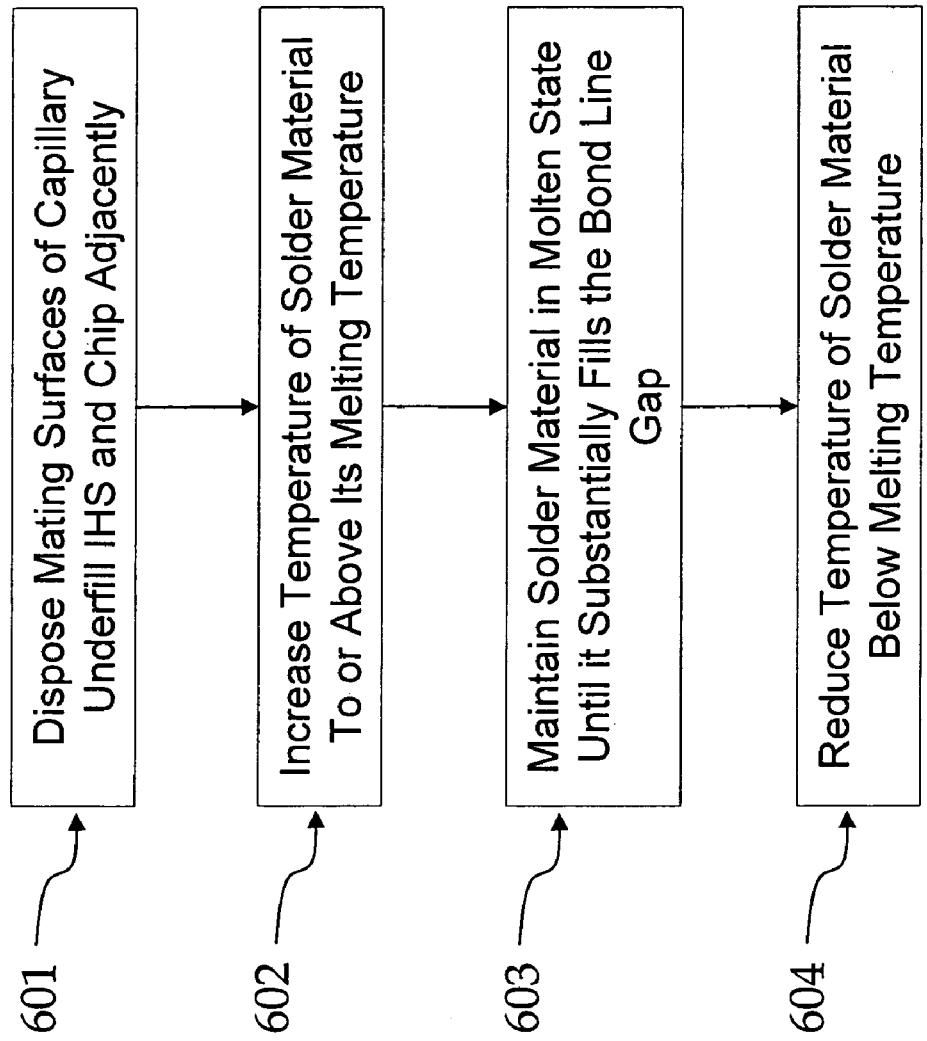
FIG. 6 depicts an method of assembling a capillary underflow IHS with a semiconductor chip, according to an embodiment of the invention.

As will be understood from the descriptions provide above, an assembly method 600, as depicted in FIG. 6, includes disposing mating surfaces of capillary underfill IHS and a chip adjacently 601, increasing the temperature of the solder material to or above its melting temperature 602, maintaining the solder material in a molten state until it substantially fills the bond line gap 603, and then reducing the temperature of the solder material below its melting temperature 604.

Among the numerous benefits provided by a capillary underflow integrated heat spreader, according to embodiments of the invention, is better control of the spread of solder TIM. The solder material generally spreads only as far as the periphery of the pattern of solder wettable material, so may not spread all the way to or beyond the periphery of the die itself. Therefore, in embodiments, the solder material substantially, but not completely fills the gap. And because the solder material generally will not flow beyond the periphery of the chip, a smaller 'keep out zone' is possible around the chip periphery, allowing capacitors, resistors, and other components to be placed more closely to the chip around the chip periphery. Not only does closer placement of components provide more available surface area on a substrate to place additional components that may be used to improve system performance, but it also shortens the trace length between a chip component (e.g., thin die) and other components placed around its periphery, improving system performance.

Another benefit of a capillary underflow IHS is uniform filling of the gap, corresponding to the pattern of wettable material, even when the mating surfaces of the IHS and the chip are not absolutely coplanar. If, occasionally, a 'thin die' chip device is warped so that the mating surface is not planar, the capillary underflow solder material will still be able to flow through the bond line gap and remain in contact with both the chip and the IHS. Thus, the capillary underflow accommodates the non-coplanar portions of the bond line, and upon solidification, provides structural stability to the warped thin die. Because capillary underflow can fill very narrow gaps, a capillary underflow IHS also can reduce the amount of solder material needed in a solder TIM. This saves substantial cost, particularly when indium is used as the solder material, since the market price of indium is both relatively high and relatively volatile.

The foregoing detailed description and accompanying drawings are only illustrative and not restrictive. They have been provided primarily for a clear and comprehensive understanding of the embodiments of the invention, and no unnecessary limitations are to be understood therefrom. Numerous additions, deletions, and modifications to the embodiments described herein, as well as alternative arrangements, may be devised by those skilled in the art without departing from the spirit of the embodiments and the scope of the appended claims.

We claim:

1. A cooling device, comprising:
a thermally conductive body having a first mating surface;
a solder wettable material disposed in a first pattern over at least a portion of the first mating surface; and
a concavity formed into the first mating surface of the thermally conductive body, the concavity being configured to receive a reflowable solder material therein, the concavity further having a tapered depth that is shallower proximate to the first pattern of solder wettable material.

2. The cooling device of claim 1, wherein a second pattern of solder wettable material is disposed at a surface of the concavity.

3. The cooling device of claim 1, wherein the concavity defines a volume adapted to contain a sufficient amount of solder material to substantially fill a bond line gap formed between the first mating surface and a second mating surface of a device to be cooled when the device to be cooled is thermally coupled to the cooling device.

4. The cooling device of claim 1, further comprising a bond line spacer projecting from the first mating surface.

5. The cooling device of claim 1, wherein the solder material is selected from the group consisting of indium, an indium alloy, lead, a lead alloy, a silver alloy, a tin alloy, a copper alloy, a bismuth alloy, a gold alloy, a phase change polymer material, and a metallic, particle-filled solder material, or some combination thereof.

6. The cooling device of claim 5, wherein the particles comprise at least one thermally conductive material different from the metallic solder material.

7. The cooling device of claim 1, wherein the solder wettable material is selected from the group consisting of gold, platinum, palladium, silver, tin, copper, and nickel.

8. The cooling device of claim 1, comprising at least one of an integral heat spreader (IHS), a passive heat dissipation device, or an active heat dissipation device.

9. An assembly method, comprising:
disposing a cooling device adjacent to a thermal component, the cooling device comprising:
  a thermally conductive body having a first mating surface;
  a solder wettable material disposed in a first pattern over at least a portion of the first mating surface;
  a concavity formed into the first mating surface of the thermally conductive body, the concavity further having a tapered depth that is shallower proximate to the first pattern of solder wettable material; and
  a reflowable solder material disposed within the concavity such that, when a portion of the solder material contacts a second mating surface of the thermal component and the solder material is exposed to reflow conditions, the solder material melts and forms a single flow front through a bond line gap between the first and second mating surfaces;
exposing the solder material to reflow conditions, including heating the solder material at least to its melting point;
maintaining the solder material in a molten state until it substantially fills the bond line gap; and
reducing the temperature of the solder material below its melting point.

10. The assembly method of claim 9, wherein the majority of the concavity lies outside a perimeter of the first pattern of solder wettable material.

11. The assembly method of claim 9, further comprising a second pattern of solder wettable material disposed at the second mating surface of the thermal component.

12. The assembly method of claim 11, wherein the first pattern of solder wettable material corresponds with at least a portion of the second pattern of solder wettable material.

13. The assembly method of claim 9, wherein the bond line gap is maintained during assembly by at least three bond line spacers, at least one of which is provided at either the first or the second mating surface.

14. The assembly method of claim 9, wherein the solder material is selected from the group consisting of indium, an indium alloy, lead, a lead alloy, a silver alloy, a tin alloy, a copper alloy, a bismuth alloy, a gold alloy, a phase change polymer material, and a metallic, particle-filled solder material, or some combination thereof, and the solder wettable material is selected from the group consisting of gold, platinum, palladium, silver, tin, copper, and nickel, or some combination thereof.

15. The assembly method of claim 14, wherein the particles comprise at least one thermally conductive material different from the metallic solder material.

16. The assembly method of claim 9, wherein the thermal component is a thin die.

17. An microelectronic package, comprising:
  a package substrate;
  at least one semiconductor device coupled with the substrate;
  a cooling device thermally coupled with the semiconductor device, the cooling device comprising:
    a thermally conductive body having a first mating surface;
    a solder wettable material disposed in a first pattern over at least a portion of the first mating surface;
    a concavity formed into the first mating surface of the thermally conductive body, the concavity being configured to receive a reflowable solder material therein, the concavity further having a tapered depth that is shallower proximate to the first pattern of solder wettable material and
  a solder joint thermally coupling a second mating surface on the semiconductor device with the first mating surface on the thermally conductive body, the solder joint substantially filling a gap between the first and second mating surfaces.

18. The package of claim 17, further comprising a computer motherboard electrically coupled with the package substrate.

19. The package of claim 17, wherein the semiconductor device is a thin die.

20. The package of claim 17, further comprising a solder wettable material disposed in a second pattern over a portion of the first mating surface.

21. The cooling device of claim 1, further comprising a reflowable solder material disposed within the concavity such that, when a portion of the solder material contacts the second mating surface and the solder material is exposed to reflow conditions, the solder material melts and forms a single flow front through a bond line gap between the first and second mating surfaces.

* * * * *